(12) United States Patent
Petre et al.

(10) Patent No.: US 10,963,403 B2
(45) Date of Patent: Mar. 30, 2021

(54) PROCESSING DISCONTIGUOUS MEMORY AS CONTIGUOUS MEMORY TO IMPROVE PERFORMANCE OF A NEURAL NETWORK ENVIRONMENT

(71) Applicant: Microsoft Technology Licensing, LLC, Redmond, WA (US)

(72) Inventors: George Petre, Redmond, WA (US); Chad Balling McBride, North Bend, WA (US); Amol Ashok Ambardekar, Redmond, WA (US); Kent D. Cedola, Bellevue, WA (US); Boris Bobrov, Kirkland, WA (US); Larry Marvin Wall, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 782 days.

(21) Appl. No.: 15/829,832

(22) Filed: Dec. 1, 2017

(65) Prior Publication Data

US 2018/0300613 A1 Oct. 18, 2018

Related U.S. Application Data

(60) Provisional application No. 62/486,432, filed on Apr. 17, 2017.

(51) Int. Cl.
*G06N 3/063* (2006.01)
*G06N 3/02* (2006.01)
(Continued)

(52) U.S. Cl.
CPC .......... *G06F 13/1673* (2013.01); *G06F 1/324* (2013.01); *G06F 1/3275* (2013.01);
(Continued)

(58) Field of Classification Search
CPC ............ G06F 13/1673; G06F 12/0207; G06F 1/3275; G06N 3/063; G06N 3/0454; G06N 3/02
(Continued)

(56) References Cited

U.S. PATENT DOCUMENTS 4,298,954 A 11/1981 Bigelow et al.
5,091,864 A 2/1992 Baji et al.
(Continued)

FOREIGN PATENT DOCUMENTS

EP 0147857 A2 7/1985
EP 2945290 A2 11/2015
(Continued)

OTHER PUBLICATIONS

"Non Final Office Action Issued in U.S. Appl. No. 15/702,311", dated May 21, 2019, 12 Pages.
(Continued)

*Primary Examiner* — Ly D Pham
(74) *Attorney, Agent, or Firm* — Newport IP, LLC; Han Gim

(57) ABSTRACT

The performance of a neural network (NN) can be limited by the number of operations being performed. Using a line buffer that is directed to shift a memory block by a selected shift stride for cooperating neurons, data that is operatively residing memory and which would require multiple write cycles into a cooperating line buffer can be processed as in a single line buffer write cycle thereby enhancing the performance of a NN/DNN. A controller and/or iterator can generate one or more instructions having the memory block shifting values for communication to the line buffer. The shifting values can be calculated using various characteristics of the input data as well as the NN/DNN inclusive of the data dimensions. The line buffer can read data for process-
(Continued)

ing, shift the data of the memory block and write the data in the line buffer for subsequent processing.

23 Claims, 10 Drawing Sheets

(51) Int. Cl.
| | |
|---|---|
| G06F 13/16 | (2006.01) |
| G06N 3/04 | (2006.01) |
| G06F 12/0862 | (2016.01) |
| G06F 9/46 | (2006.01) |
| G06F 1/324 | (2019.01) |
| G06F 3/06 | (2006.01) |
| G06F 9/38 | (2018.01) |
| G06F 12/08 | (2016.01) |
| G06F 12/10 | (2016.01) |
| G06F 15/80 | (2006.01) |
| G06F 17/15 | (2006.01) |
| G06N 3/06 | (2006.01) |
| G06N 3/08 | (2006.01) |
| G06N 3/10 | (2006.01) |
| H03M 7/30 | (2006.01) |
| H04L 12/715 | (2013.01) |
| H04L 29/08 | (2006.01) |
| G06F 1/3234 | (2019.01) |
| G06F 12/02 | (2006.01) |
| G06F 13/28 | (2006.01) |
| H03M 7/46 | (2006.01) |
| H04L 12/723 | (2013.01) |

(52) U.S. Cl.
CPC ............ *G06F 3/0604* (2013.01); *G06F 3/067* (2013.01); *G06F 3/0631* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(58) Field of Classification Search
USPC ..................................................... 706/41, 15
See application file for complete search history.

(56) References Cited

U.S. PATENT DOCUMENTS

| | | | |
|---|---|---|---|
| 5,487,153 | A | 1/1996 | Hammerstrom et al. |
| 5,524,175 | A | 6/1996 | Sato et al. |
| 5,644,749 | A | 7/1997 | Obayashi |
| 5,859,990 | A | 1/1999 | Yarch |
| 5,933,654 | A | 8/1999 | Galdun et al. |
| 6,307,867 | B1 | 10/2001 | Roobol et al. |
| 6,654,730 | B1 | 11/2003 | Kato et al. |
| 6,785,239 | B1 | 8/2004 | Tasker |
| 6,990,079 | B2 | 1/2006 | Vrabel |
| 7,012,893 | B2 | 3/2006 | Bahadiroglu |
| 7,480,640 | B1 | 1/2009 | Elad et al. |
| 7,539,608 | B1 | 5/2009 | Dageville et al. |
| 7,694,084 | B2 | 4/2010 | Raghavan et al. |
| 8,244,953 | B1 | 8/2012 | Kumar |
| 8,442,927 | B2 | 5/2013 | Chakradhar et al. |
| 8,892,488 | B2 | 11/2014 | Qi et al. |
| 8,966,413 | B2 | 2/2015 | Shacham et al. |
| 9,015,096 | B2 | 4/2015 | Hunzinger |
| 9,143,393 | B1 | 9/2015 | Bird et al. |
| 9,378,044 | B1 | 6/2016 | Gaurav et al. |
| 9,851,771 | B2 | 12/2017 | Cooper et al. |
| 9,990,307 | B1 | 6/2018 | Patel et al. |
| 10,275,001 | B2 | 4/2019 | Kam et al. |
| 2002/0133648 | A1 | 9/2002 | Goudie et al. |
| 2003/0065631 | A1 | 4/2003 | Mcbride |
| 2003/0120799 | A1 | 6/2003 | Lahav et al. |
| 2003/0200315 | A1 | 10/2003 | Goldenberg et al. |
| 2004/0187135 | A1 | 9/2004 | Pronovost et al. |
| 2005/0204189 | A1 | 9/2005 | Akiba |
| 2005/0216616 | A1 | 9/2005 | Eldar et al. |
| 2006/0047864 | A1 | 3/2006 | Brokenshire et al. |
| 2007/0145151 | A1 | 6/2007 | Nakamura et al. |
| 2008/0043742 | A1 | 2/2008 | Pong et al. |
| 2008/0052441 | A1 | 2/2008 | Freking et al. |
| 2008/0112438 | A1 | 5/2008 | Ying et al. |
| 2008/0313385 | A1 | 12/2008 | Vijayakumar et al. |
| 2008/0319933 | A1 | 12/2008 | Moussa et al. |
| 2009/0037697 | A1 | 2/2009 | Ramani et al. |
| 2009/0313195 | A1 | 12/2009 | Mcdaid et al. |
| 2010/0180100 | A1 | 7/2010 | Lu et al. |
| 2010/0257174 | A1 | 10/2010 | Minuti |
| 2010/0281192 | A1 | 11/2010 | Rakib et al. |
| 2011/0246722 | A1 | 10/2011 | Taha et al. |
| 2012/0130928 | A1 | 5/2012 | Bell et al. |
| 2012/0134449 | A1 | 5/2012 | Chen et al. |
| 2014/0046882 | A1 | 2/2014 | Wood |
| 2014/0181464 | A1 | 6/2014 | Forsyth et al. |
| 2014/0281221 | A1 | 9/2014 | Wang et al. |
| 2014/0372670 | A1 | 12/2014 | Vasilyuk |
| 2015/0363239 | A1 | 12/2015 | Hsu et al. |
| 2016/0098388 | A1 | 4/2016 | Blevins et al. |
| 2016/0184587 | A1 | 6/2016 | Heuvel et al. |
| 2016/0267377 | A1 | 9/2016 | Pan et al. |
| 2016/0328644 | A1 | 11/2016 | Lin et al. |
| 2016/0335119 | A1 | 11/2016 | Merrill et al. |
| 2016/0350653 | A1 | 12/2016 | Socher et al. |
| 2017/0011288 | A1 | 1/2017 | Brothers et al. |
| 2017/0199902 | A1 | 7/2017 | Mishra et al. |
| 2018/0299943 | A1 | 10/2018 | Mcbride et al. |
| 2018/0300601 | A1 | 10/2018 | Cedola et al. |
| 2018/0300602 | A1 | 10/2018 | Petre et al. |
| 2018/0300603 | A1 | 10/2018 | Ambardekar et al. |
| 2018/0300604 | A1 | 10/2018 | Mcbride et al. |
| 2018/0300605 | A1 | 10/2018 | Ambardekar et al. |
| 2018/0300606 | A1 | 10/2018 | Corkery et al. |
| 2018/0300607 | A1 | 10/2018 | Petre et al. |
| 2018/0300614 | A1 | 10/2018 | Ambardekar et al. |
| 2018/0300615 | A1 | 10/2018 | Ambardekar et al. |
| 2018/0300616 | A1 | 10/2018 | Ambardekar et al. |
| 2018/0300617 | A1 | 10/2018 | Mcbride et al. |
| 2018/0300633 | A1 | 10/2018 | Mcbride et al. |
| 2018/0300634 | A1 | 10/2018 | Mcbride et al. |
| 2020/0233820 | A1 | 7/2020 | Mcbride et al. |

FOREIGN PATENT DOCUMENTS

| | | |
|---|---|---|
| EP | 3035204 A1 | 6/2016 |
| EP | 3035249 A1 | 6/2016 |
| WO | 1993014459 A1 | 7/1993 |
| WO | 2016118257 A1 | 7/2016 |
| WO | 2016210030 A1 | 12/2016 |

OTHER PUBLICATIONS

"Ex Parte Quayle Action Issued in U.S. Appl. No. 15/950,644", dated Sep. 23, 2019, 7 Pages.

(56) References Cited

OTHER PUBLICATIONS

"Non Final Office Action Issued in U.S. Appl. No. 15/702,311", dated Jun. 29, 2018, 10 Pages.
"International Search Report and Written Opinion Issued in PCT Application No. PCT/US2018/026358", dated Jul. 11, 2018, 15 Pages.
"International Search Report and Written Opinion Issued in PCT Application No. PCT/US2018/026352", dated Jun. 27, 2018, 11 Pages.
"International Search Report and Written Opinion Issued in PCT Application No. PCT/US2018/026353", dated Jul. 6, 2018, 15 Pages.
"International Search Report and Written Opinion Issued in PCT Application No. PCT/US2018/026354", dated Jul. 31, 2018, 15 Pages.
"International Search Report and Written Opinion Issued in PCT Application No. PCT/US2018/026355", dated Jul. 9, 2018, 16 Pages.
"International Search Report and Written Opinion Issued in PCT Application No. PCT/US2018/026356", dated Jul. 6, 2018, 16 Pages.
"International Search Report and Written Opinion Issued in PCT Application No. PCT/US2018/026357", dated Jul. 9, 2018, 16 Pages.
"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Notice of Allowance Issued in U.S. Appl. No. 15/694,663", dated May 8, 2020, 9 Pages.
"Notice of Allowance Issued in U.S. Appl. No. 15/702,311", dated Sep. 11, 2019, 6 Pages.
Chi, et al., "PRIME: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.

PROCESSING DISCONTIGUOUS MEMORY AS CONTIGUOUS MEMORY TO IMPROVE PERFORMANCE OF A NEURAL NETWORK ENVIRONMENT

RELATED APPLICATION

This application claims priority under 35 U.S.C. § 119(e) to U.S. Provisional Patent Application No. 62/486,432, filed on Apr. 17, 2017 and titled "Enhanced Neural Network Designs," the entire disclosure of which is incorporated in its entirety by reference herein.

BACKGROUND

In artificial neural networks (NN), a neuron is the base unit used to model a biological neuron in the brain. The model of an artificial neuron includes the inner product of an input vector with a weight vector added to a bias with a non-linearity applied. For deep neural networks (DNN) (e.g., as expressed by an exemplary DNN module), a neuron can be closely mapped to an artificial neuron. Operatively, a DNN is working to its optimal performance when its neurons are continuously processing data and avoiding instances where a neuron or group of neurons is/are not processing data during a processing cycle.

In processing data across a NN or a DNN, a controller performing exemplary processing operations is required to iterate over large amounts of data in order to apply specific operations. Such requirements can impact overall NN or DNN performance resulting in crucial latency to the detriment of a desired stated processing goal (e.g., identifying an object and/or object characteristic in exemplary input data—image, sound, geographic coordinates, etc.). Typically, some existing NN and DNN expend avoidable processing time (e.g., floating/fixed point operations per second (GFlops/s)) and memory space (e.g., number of bytes transferred per second (GBytes/s)) in performing various operations inclusive of memory reads and writes to various cooperating memory components of the NN/DNN (e.g., line buffer). Specifically, current practices do not identify critical features of input/data and/or provide instructions to the cooperating components of the NN or DNN regarding how best to manage/direct the read/write operations for the input data in the cooperating NN or DNN memory components inclusive of the line buffer to avoid such performance issues. Part in parcel with the performance impact associated with inefficient data processing in NN or DNN is the inefficient processing of data amongst the neural processing components of the NN or DNN. Such inefficient data management and processing requires additional, often avoidable, computations/neural processor operations further impacting overall NN/DNN performance.

A more advantageous NN/DNN would deploy set of instructions that directs the cooperating memory components of the NN/DNN, and specifically, the line buffer, to operatively shift a memory block by a shift stride for each consecutive neuron. Operatively, the shifting of the memory block can allow for the extraction of data for multiple overlapping/consecutive sliding windows from a single memory block in a single processing cycle. As such, a data in memory can be treated as a contiguous memory block for processing resulting in increased overall performance of the NN/DNN.

It is with respect to these considerations and others that the disclosure made herein is presented.

SUMMARY

Techniques described herein provide for the virtualization of one or more hardware iterators to be utilized in an exemplary neural network (NN) and/or Deep Neural Network (DNN) environment, wherein a cooperating line buffer component operatively allows for the processing of data that improves overall performance and optimizes memory management. In an illustrative implementation, an exemplary DNN environment can comprise one or more processing blocks (e.g., computer processing units—CPUs), a memory controller, a line buffer, a high bandwidth fabric (e.g., local or external fabric) (e.g., data bus passing data and/or data elements between an exemplary DNN module and the cooperating components of a DNN environment), operation controller, and a DNN module. In the illustrative implementation, the exemplary DNN module can comprise an exemplary DNN state controller, a descriptor list controller (DLC), dMA (DDMA), DMA Streaming Activations (DSA), an operation controller, a load controller, and a store controller.

In an illustrative operation, the operational controller of the NN/DNN environment can operatively process large amounts of data in order to apply one or more desired data processing operations (e.g., convolution, max pooling, scalar multiply/add, summation, fully connected, etc.). In the illustrative operation, a participating user can specify the dimensions of the data being processed as well as the configuration on how to process through the data for use by the NN/DNN computing environment through the use of a line buffer that operatively receives one or more instructions from a cooperating operations controller/iterator to perform various operations inclusive but not limited to processing of data and memory management operations.

In an illustrative implementation, data to be processed by the NN/DNN environment can be represented as a blob. Generally, a blob represents the data in memory that needs to be iterated. Each blob can maintain a logical mapped shape defined by various dimensions such as width, height, number of channels, number of kernels, and other available dimensional units. In an illustrative operation, the operations controller can traverse across a multi-dimensional blob (e.g., as defined by a logical data mapping) or a smaller N dimensional slice of such a blob, where N is the number of dimensions (e.g., for a 3D blob representing an image with width, height and number of channels–N=3) (e.g., using one or more hardware or virtualized iterators). The traversed blob can be communicated to a cooperating line buffer with one or more instructions to manage the read/writes of the traversed data within the line buffer. A blob of data can be processed by various components of the NN/DNN inclusive of an iterator capable of processing input data and an iterator capable of processing output data that can be illustratively outputted from one or more cooperating processing units of the NN/DNN.

Illustratively, the line buffer can operatively shift the data of a memory block by the shift stride of one or more cooperating processing units such as a neuron. The line buffer can be architected to store data in a predefined number of rows/lines (e.g., 64 rows, lines) that can receive a selected amount of data amongst the rows/lines (e.g., 32 bytes of data can be received for each line of the line buffer). The line buffer can operate to shift the memory block data on a calculated shift stride that illustratively can be based on the characteristics of the input data (e.g., shift stride, continuity, height, width, kernel, etc.) (e.g., if stride has a value of 0 then the lines of a line buffer can have the same data, whereas if the stride has a value of 1, the data can be shifted by 1 to allow for more efficient read/write operation within the line buffer). Operatively, the line buffer can read additional data from the cooperating memory block that operatively resides in memory to allow for a single read from the cooperating memory rendering the data of the memory block as having been in a contiguous memory block.

Illustratively, data written to the line buffer can operatively be processed by one or more cooperating processing units such one or more neurons to generate output data. The output data can further include one or more data elements representative of data elements inserted during an exemplary shift stride operation that can be discarded when writing the generated output data to a cooperating memory component.

It should be appreciated that, although described in relation to a system, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
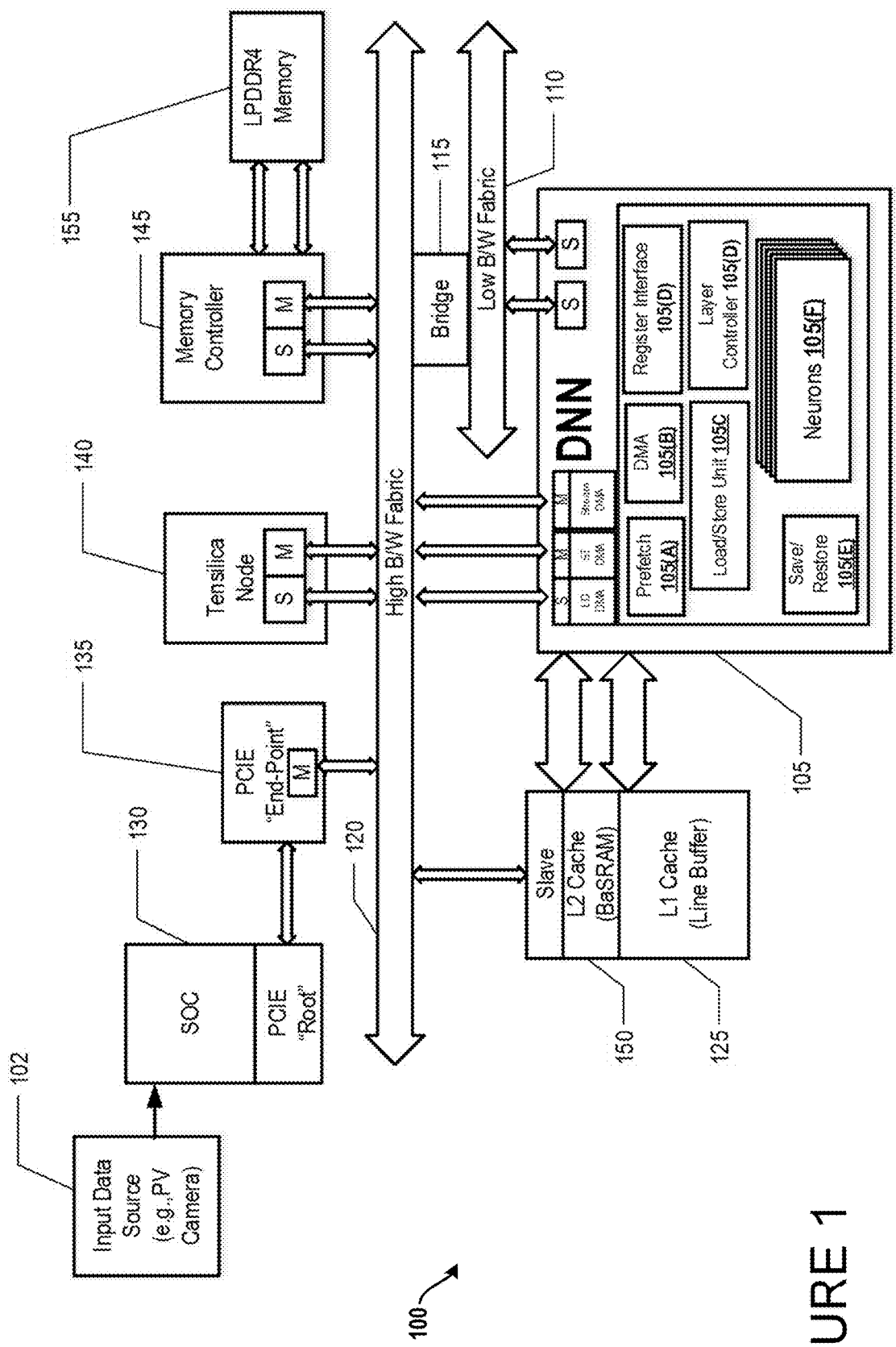
FIG. 1 illustrates a block diagram of an exemplary neural networking computing environment in accordance with the herein described systems and methods.

The following Detailed Description describes techniques for the virtualization of one or more hardware iterators to be utilized in an exemplary neural network (NN) and/or Deep Neural Network (DNN) environment, wherein a cooperating line buffer component operatively allows for the processing of data that improves overall performance and optimizes memory management. In an illustrative implementation, an exemplary DNN environment can comprise one or more processing blocks (e.g., computer processing units—CPUs), a memory controller, a line buffer, a high bandwidth fabric (e.g., local or external fabric) (e.g., data bus passing data and/or data elements between an exemplary DNN module and the cooperating components of a DNN environment), an operation controller, and a DNN module. In the illustrative implementation, the exemplary DNN module can comprise an exemplary DNN state controller, a descriptor list controller (DLC), dMA (DDMA), DMA Streaming Activations (DSA), an operation controller, a load controller, and a store controller.

It should be appreciated that the described subject matter may be implemented as a computer-controlled apparatus, a computer process, a computing system, or as an article of manufacture such as a computer-readable storage medium. Among many other benefits, the techniques herein improve efficiencies with respect to a wide range of computing resources. For instance, the determine of the shift stride can reduce a number of computing cycles needed to perform a number of complex tasks, such as facial recognition, object recognition, image generation, etc.

In addition, improved human interaction can be achieved by the introduction of more accurate and faster completion of such tasks. In addition, the use of the shift stride can reduce network traffic, reduce power consumption and usage of memory. Other technical effects other than those mentioned herein can also be realized from implementations of the technologies disclosed herein.

In an illustrative operation, the operational controller of the NN/DNN environment can operatively process large amounts of data in order to apply one or more desired data processing operations (e.g., convolution, max pooling, scalar multiply/add, summation, fully connected, etc.). In the illustrative operation, a participating user can specify the dimensions of the data being processed as well as the configuration on how to process through the data for use by the NN/DNN computing environment through the use of a line buffer that operatively receives one or more instructions from a cooperating operation controller/iterator to perform various operations inclusive but not limited to processing of data and memory management operations.

In an illustrative implementation, data to be processed by the NN/DNN environment can be represented as a blob. Generally, a blob represents the data in memory that needs to be iterated. Each blob can maintain a logical mapped shape defined by various dimensions such as width, height, number of channels, number of kernels, and other available dimensional units. In an illustrative operation, the operations controller can traverse a multi-dimensional blob (e.g., as defined by a logical data mapping) or a smaller N dimensional slice of such a blob, where N is the number of dimensions (e.g., for a 3D blob representing an image with width, height and number of channels–N=3)(e.g., using one or more hardware or virtualized iterators). The traversed blob can be communicated to a cooperating line buffer with one or more instructions to manage the read/writes of the traversed data within the line buffer. A blob of data can be processed by various components of the NN/DNN inclusive of an iterator capable of processing input data and an iterator capable of processing output data that can be illustratively outputted from one or more cooperating processing units of the NN/DNN.

Illustratively, the line buffer can operatively shift the data of a memory block by a shift stride which can be considered as the shift of one or more the values in a memory block that can be written in the line buffer at any position. The line buffer can be architected to store data in a predefined number of rows/lines (e.g., 64 rows, lines) that can receive a selected amount of data amongst the rows/lines (e.g., 32 bytes of data can be received for each line of the line buffer). The line buffer can operate to shift the memory block data on a shift stride that illustratively can be based on the characteristics of the input data (e.g., shift stride, continuity, height, width, kernel, etc.) (e.g., if stride has a value of 0 then the lines of a line buffer can have the same data, whereas if the stride has a value of 1, the data can be shifted by 1 to allow for more efficient read/write operation within the line buffer). Operatively, the line buffer can read additional data from the cooperating memory block that operatively resides in memory to allow for a single read from the cooperating memory rendering the data of the memory block as having been in a contiguous memory block.

Illustratively, data written to the line buffer can operatively be processed by one or more cooperating processing units such one or more neurons to generate output data. The output data can further include one or more data elements representative of data elements inserted during an exemplary shift stride operation that can be discarded when writing the generated output data to a cooperating memory component.
Neural Networks Background:

In artificial neural networks, a neuron is the base unit used to model a biological neuron in the brain. The model of an artificial neuron can include the inner product of an input vector with a weight vector added to a bias, with a non-linearity applied. Comparatively, a neuron, in an exemplary DNN module, (e.g., 105 of FIG. 1) is closely mapped to an artificial neuron.

Illustratively, the DNN module can be considered a superscalar processor. Operatively, it can dispatch one or more instructions to multiple execution units called neurons. The execution units can be "simultaneous dispatch simultaneous complete" where each execution unit is synchronized with all of the others. A DNN module can be classified as a SIMD (single instruction stream, multiple data stream) architecture.

Turning to exemplary DNN environment 100 of FIG. 1, DNN module 105 has a memory subsystem with a unique L1 and L2 caching structure. These are not traditional caches, but are designed specifically for neural processing. For convenience, these caching structures have adopted names that reflect their intended purpose. By way of example, the L2 cache 150 can illustratively maintain a selected storage capacity (e.g., one megabyte (1 MB)) with a high speed private interface operating at a selected frequency (e.g., sixteen giga-bits per second (16 GBps)). The L1 cache can maintain a selected storage capacity (e.g., eight kilobytes (8 KB) that can be split between kernel and activation data. The L1 cache can be referred to as a Line Buffer, and the L2 cache is referred to as BaSRAM.

The DNN module can be a recall-only neural network and programmatically support a wide variety of network structures. Training for the network can be performed offline in a server farm or data center. The result of training is a set of parameters that can be known as either weights or kernels. These parameters represent a transform function that can be applied to an input with the result being a classification or semantically labeled output.

In an illustrative operation, the DNN module can accept planar data as input. Input is not limited to image data only, as long as the data presented is in a uniform planar format the DNN can operate on it.

The DNN module operates on a list of layer descriptors which correspond to the layers of a neural network. Illustratively, the list of layer descriptors can be treated by the DNN module as instructions. These descriptors can be pre-fetched from memory into the DNN module and executed in order.

Generally, there can be two main classes of layer descriptors: 1) Memory-to-memory move descriptors, and 2) Operation descriptors. Memory-to-memory move descriptors can be used to move data to/from the main memory to/from a local cache for consumption by the operation descriptors. Memory-to-memory move descriptors follow a different execution pipeline than the operation descriptors. The target pipeline for memory-to-memory move descriptors can be the internal DMA engine, whereas the target pipeline for the operation descriptors can be the neuron processing elements. Operation descriptors are capable of many different layer operations.

The output of the DNN is also a blob of data. The output can optionally be streamed to a local cache or streamed to main memory. The DNN module can pre-fetch data as far ahead as the software will allow. Software can control pre-fetching by using fencing and setting dependencies between descriptors. Descriptors that have dependencies sets are prevented from making forward progress until the dependencies have been satisfied.

Turning now to FIG. 1, an exemplary neural network environment 100 can comprise various cooperating components inclusive of DNN module 105, cache memory 125 or 150, low bandwidth fabric 110, bridge component 115, high bandwidth fabric 120, SOC 130, PCIE "End Point" 135, Tensilica Node 140, memory controller 145, LPDDR4 memory 155, and an input data source 102. Further, as is shown, DNN module 105 can also comprise a number of components comprising prefetch 105(A), DMA 105(B), Register Interface 105(D), load/store unit 105(C), layer controller 105(D), save/restore component 105(E), and neurons 105(F). Operatively, an exemplary DNN environment 100 can process data according to a selected specification wherein the DNN module performs one or more functions as described herein.

Figure 2:
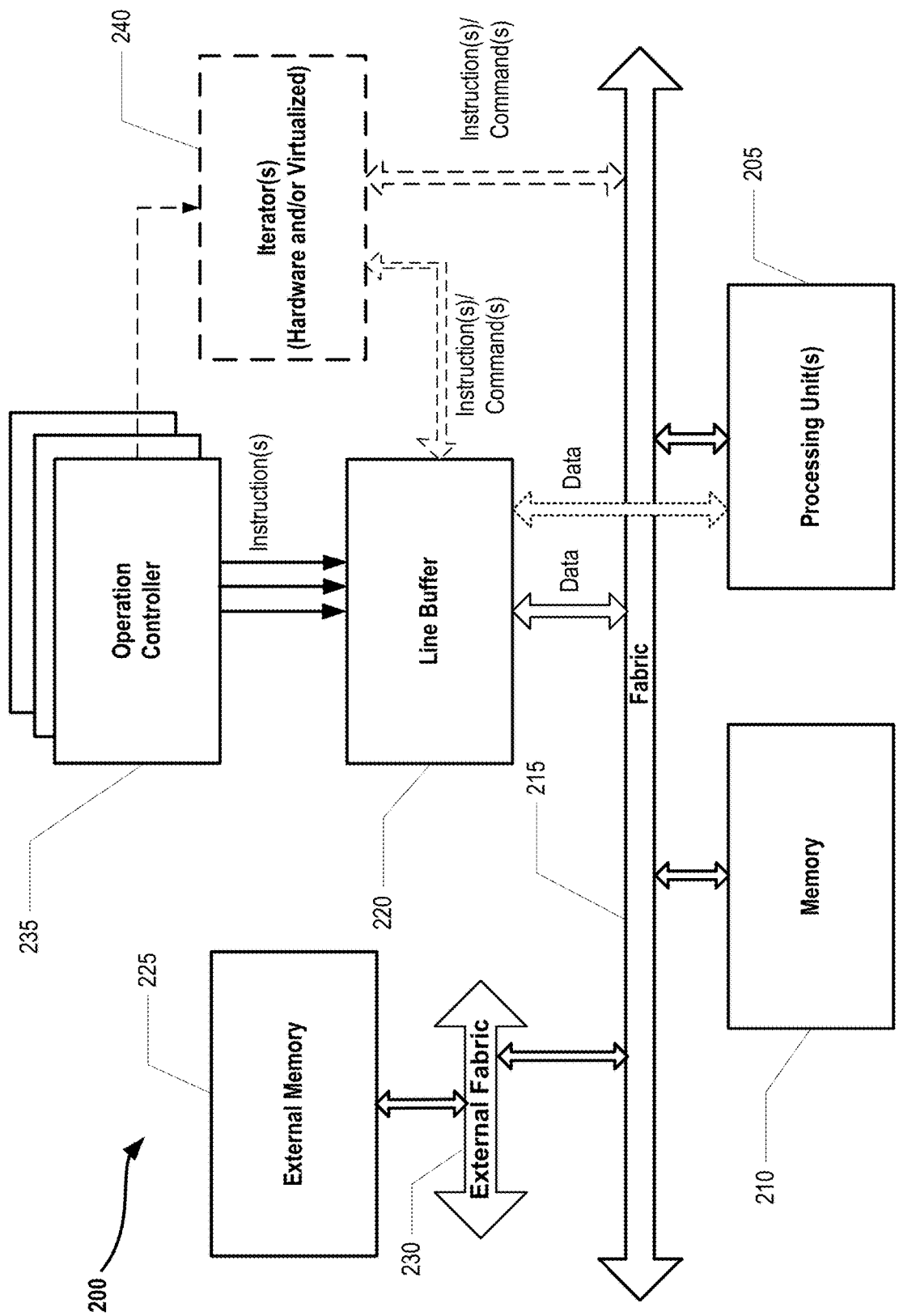
FIG. 2 illustrates a block diagram of an exemplary neural networking environment utilizing a directed line buffer.

FIG. 2 illustrates an exemplary neural network environment 200 operable to employ a directed line buffer 220 as part of data processing. As is shown, the exemplary neural network environment 200 (also referred to herein as a computing device or a computing device environment) comprises one or more operation controllers 235 that cooperate with line buffer 220 to provide one or more instructions for data processing. Line buffer 220 can operate to receive data from cooperating external memory component 225 through external fabric 230 and fabric 215 as well as operating to receive one or more instructions/commands from iterator(s) 240 (e.g., hardware based and/or virtualized iterators) (e.g., an instruction/command to read data from a cooperating memory component and/or an instruction to write data loaded from the cooperating memory component in the line buffer). Operatively, line buffer 220 can shift data according to a selected stride width according to one or more instructions received from one or more operation controller(s) 235 (also referred to herein as a "cooperating controller component 235"). Furthermore, line buffer 220 can cooperate with processing unit(s) (e.g., neuron(s)) to provide the written bit shifted data for further processing directly or indirectly through fabric 215. A neural network environment fabric can be a data bus capable of passing through various data. A directed line buffer can be considered as a memory component capable of reading and writing data and/or data elements according to one or more received instructions.

Figure 6:
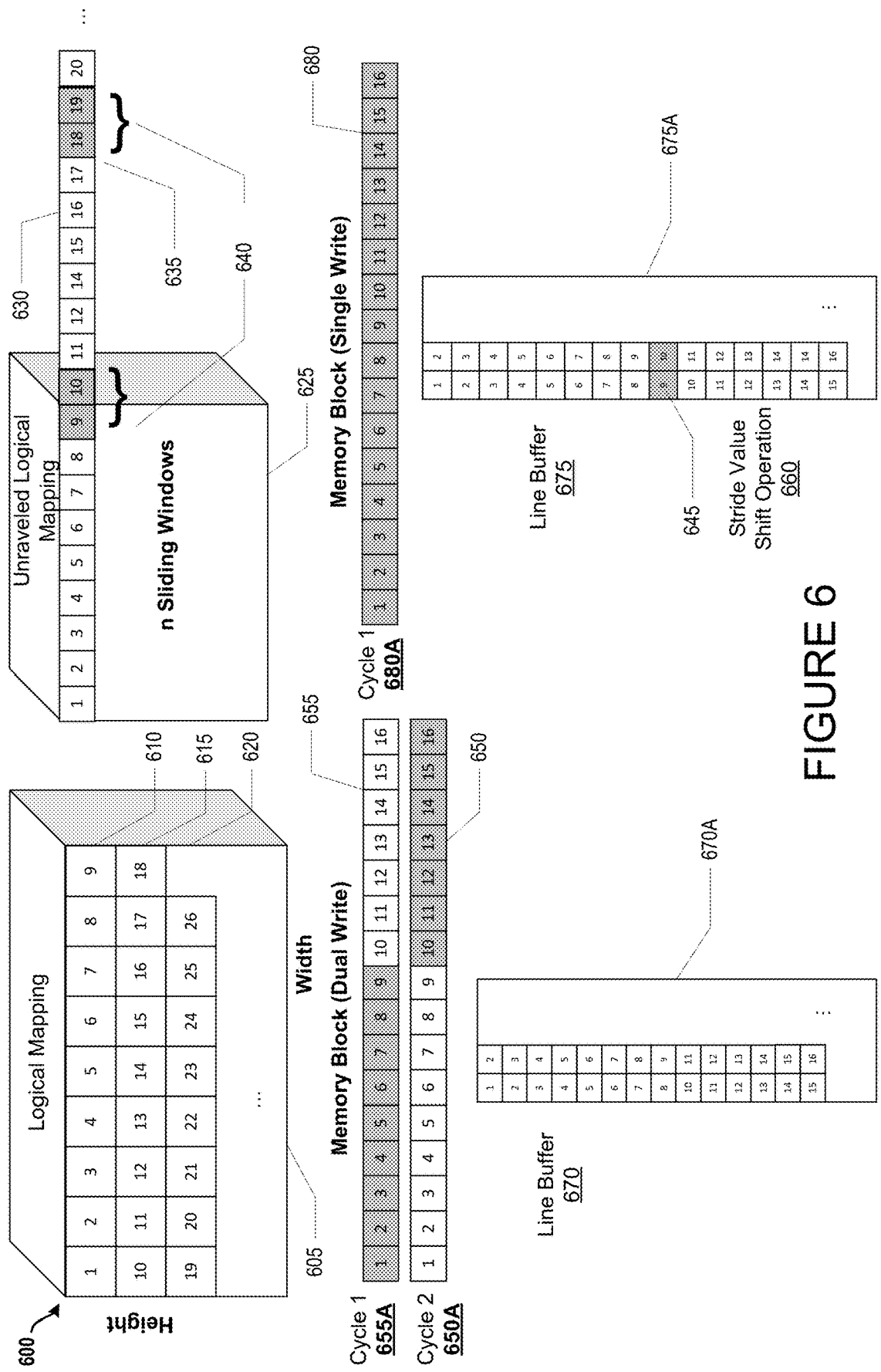
FIG. 6 illustrates a block diagram of exemplary input data represented in an illustrative logical data mapping showing the use of a shifting stride to allow for contiguous memory read/write operations within a directed line buffer according to the herein described systems and methods.
Figure 7:
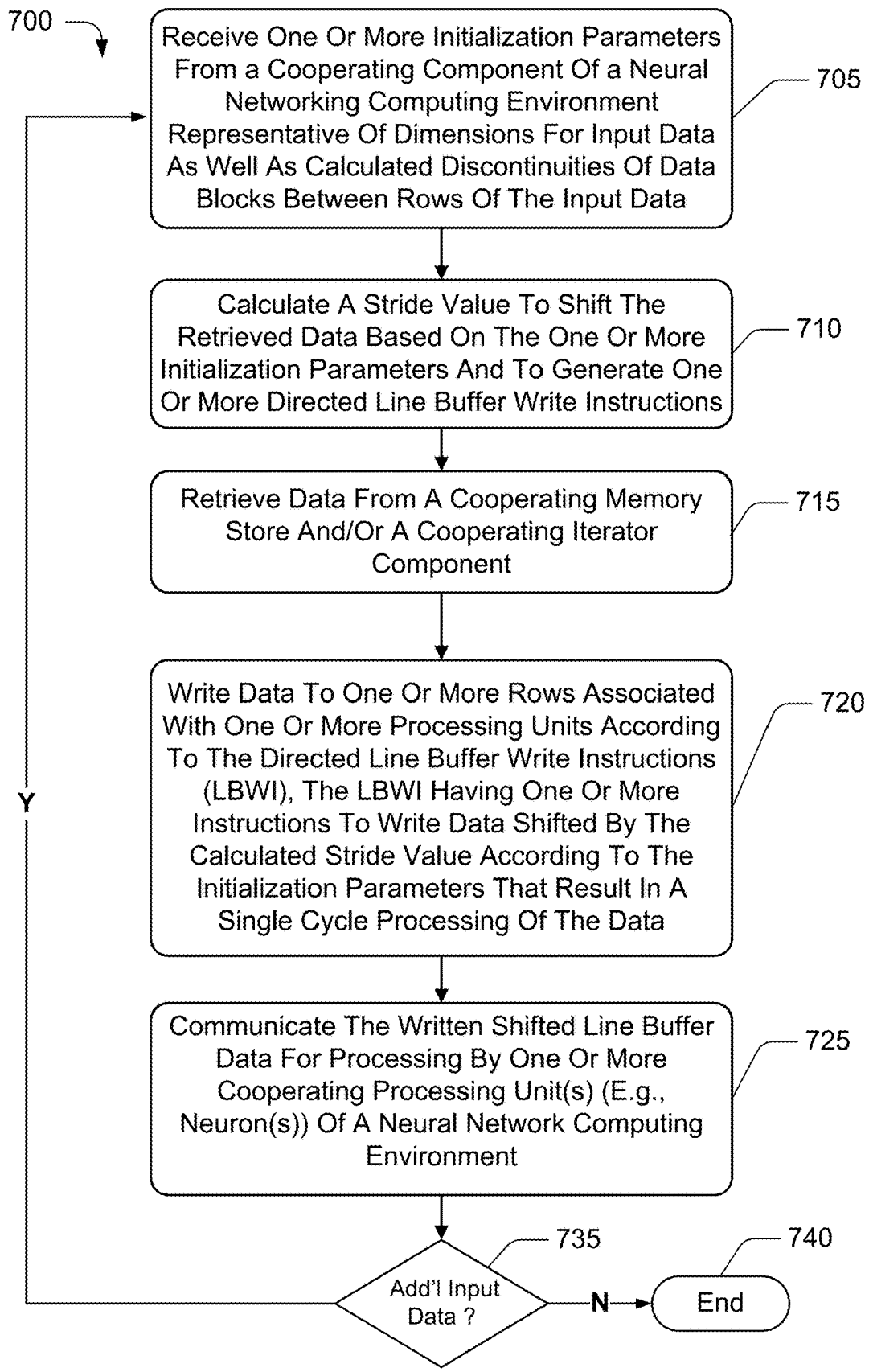
FIG. 7 is a flow diagram of an illustrative process for processing of data in an exemplary neural network environment using a directed line buffer in accordance with the herein described systems and methods.

In the illustrative operation, the exemplary neural network environment 200 can operatively process data according to the process described in FIG. 7. Specific to the components described in FIG. 2, these components are merely illustrative, as one of ordinary skill in the art would appreciate the processing described in FIGS. 6 and 7 to be also performed by other components than those illustrated in FIG. 2.

Also, as is shown in FIG. 2, the exemplary neural network environment can optionally include one or more iterators (e.g., hardware based and/or virtualized iterators) (as indicated by the dashed lines) that can illustratively operate to iterate input data (not shown) for processing by one more neuron processors 205. It is appreciated by one skilled in the art that such optional inclusion of exemplary one or more iterators is merely illustrative as the inventive concepts described by the herein disclosed systems and methods are operative in an exemplary neural network environment 200 operating without any iterators.

Figure 3:
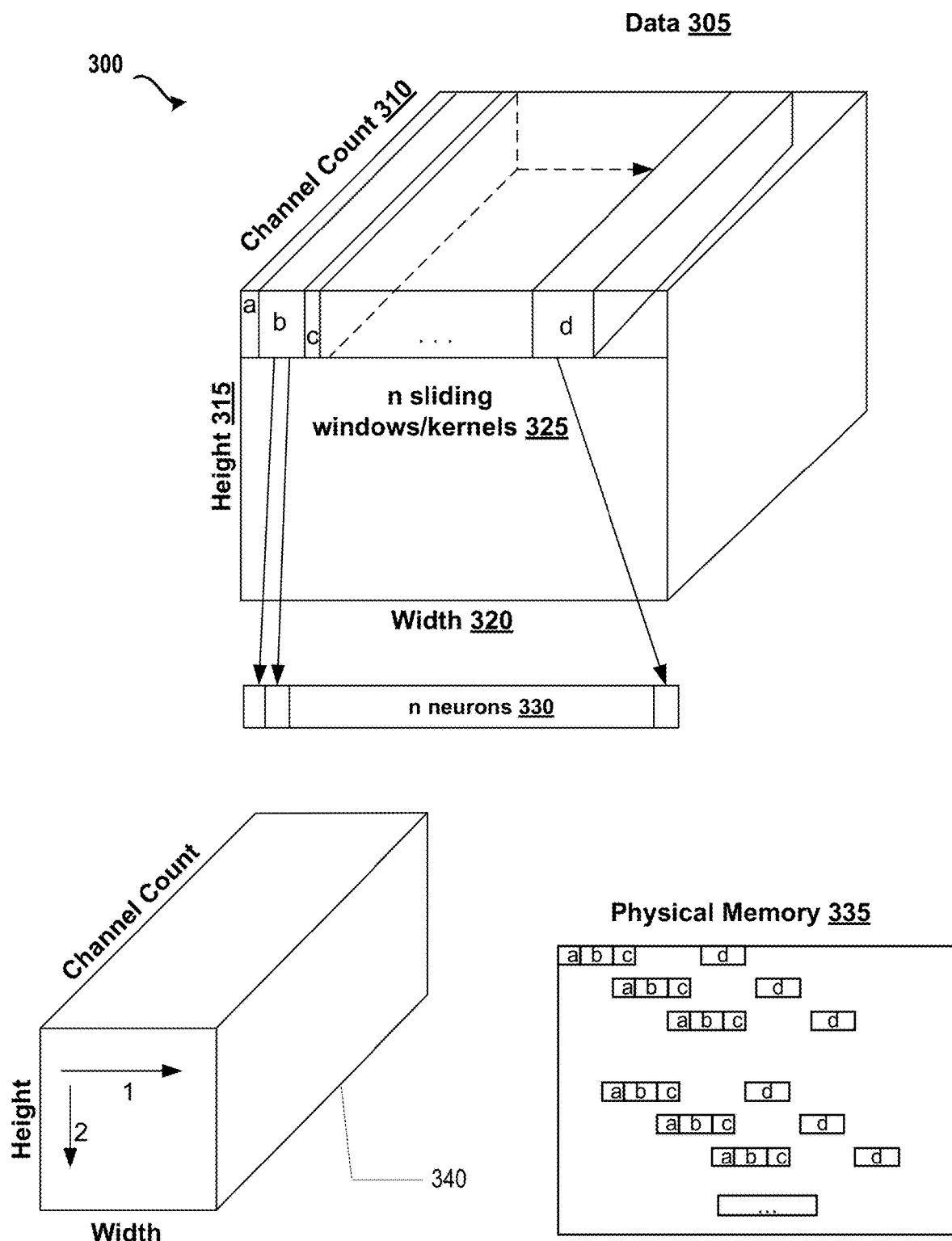
FIG. 3 illustrates a block diagram of exemplary input data represented in an illustrative logical data mapping according to the herein described systems and methods.

FIG. 3 illustrates an example logical data mapping 300 for exemplary input data. As is shown, data 305 can be represented as data having a certain dimension 340 (e.g., such that data dimensions taken as a whole can define a data volume) comprising channel count 310, height 315, and width 320. According to the herein described systems and methods, data 305 can be portioned and prepared for processing by cooperating n neurons 330 such that a first portion a can be communicated to a first neuron, a second portion b can be communicated to a second neuron, and so forth until n portions are communicated to n neurons.

In an illustrative operation, the portions of data 305 can be determined using n sliding window/kernels 325 based on one or more instructions provided by a cooperating controller component of an exemplary neural network environment (e.g., 200 of FIG. 2). Further, as is shown, the input data portions a, b, c, and d can be addressed to a physical memory 325 using one or more initialization parameters provided by a cooperating operation controller component (235) of an exemplary neural network environment (e.g., 200 of FIG. 2).

Figure 4:
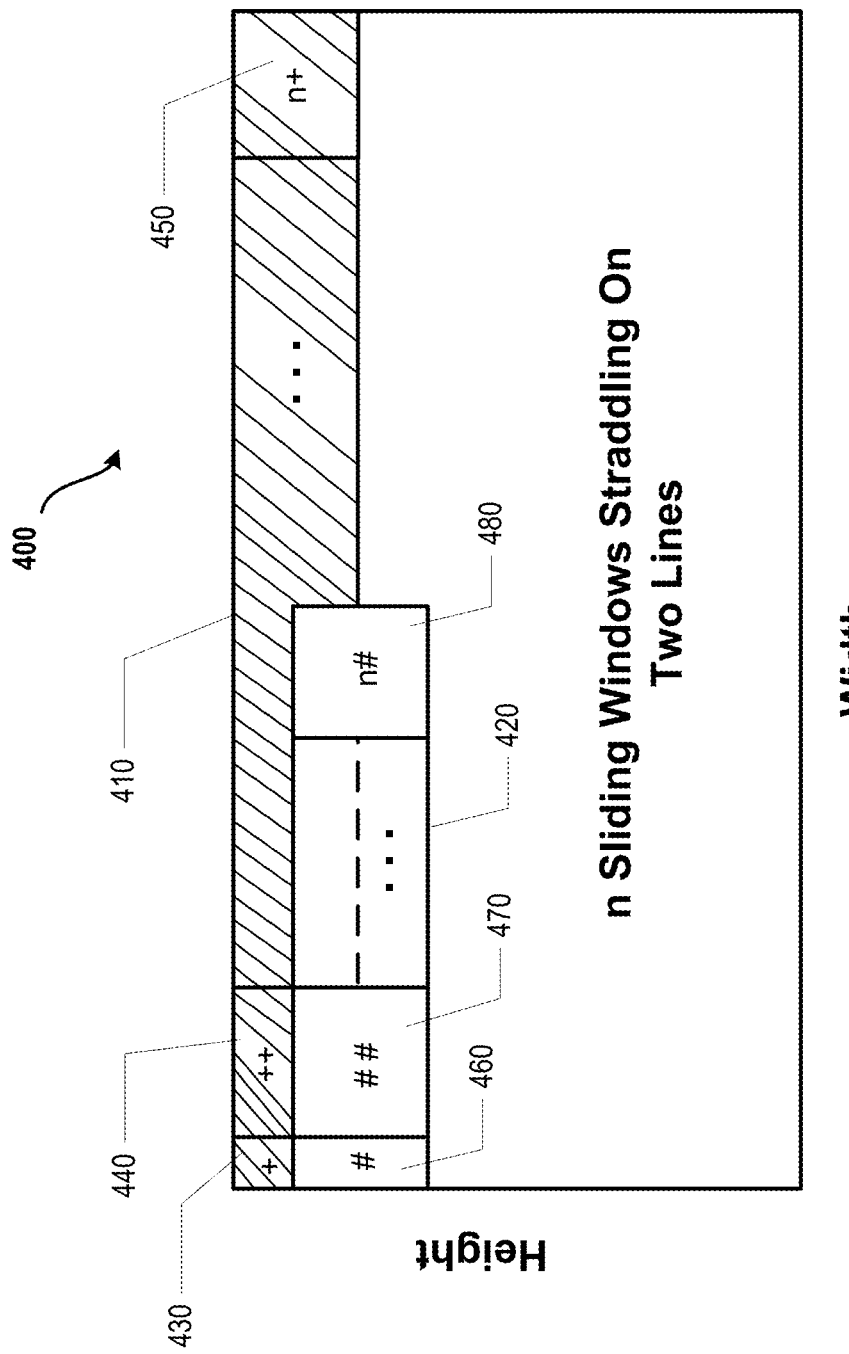
FIG. 4 illustrates a block diagram of exemplary input data represented in an illustrative logical data mapping showing the use of illustrative n sliding windows operative to straddle one or more lines of the illustrative logical data mapping.

FIG. 4, illustrates an exemplary logical data map 400 of exemplary input data (not shown). Exemplary logical data map 400 comprises a first line 410 (illustrated with diagonal marks) and a second line 420 (illustrated by dashes). Each map line can include a number of sliding windows (e.g., 430, 440, and 450 for the first line 410 and 460, 470, and 480 for the second line 420). Additionally, as is shown, the logical data map 400 shows the ability of the sliding windows to straddle a data dimensional boundary of the input data (e.g., straddling the first line 410 and the second line 420). Such ability allows for increased performance as more data can be prepared more efficiently for subsequent processing by the cooperating neural network processing components (e.g., 205 of FIG. 2).

Figure 5:
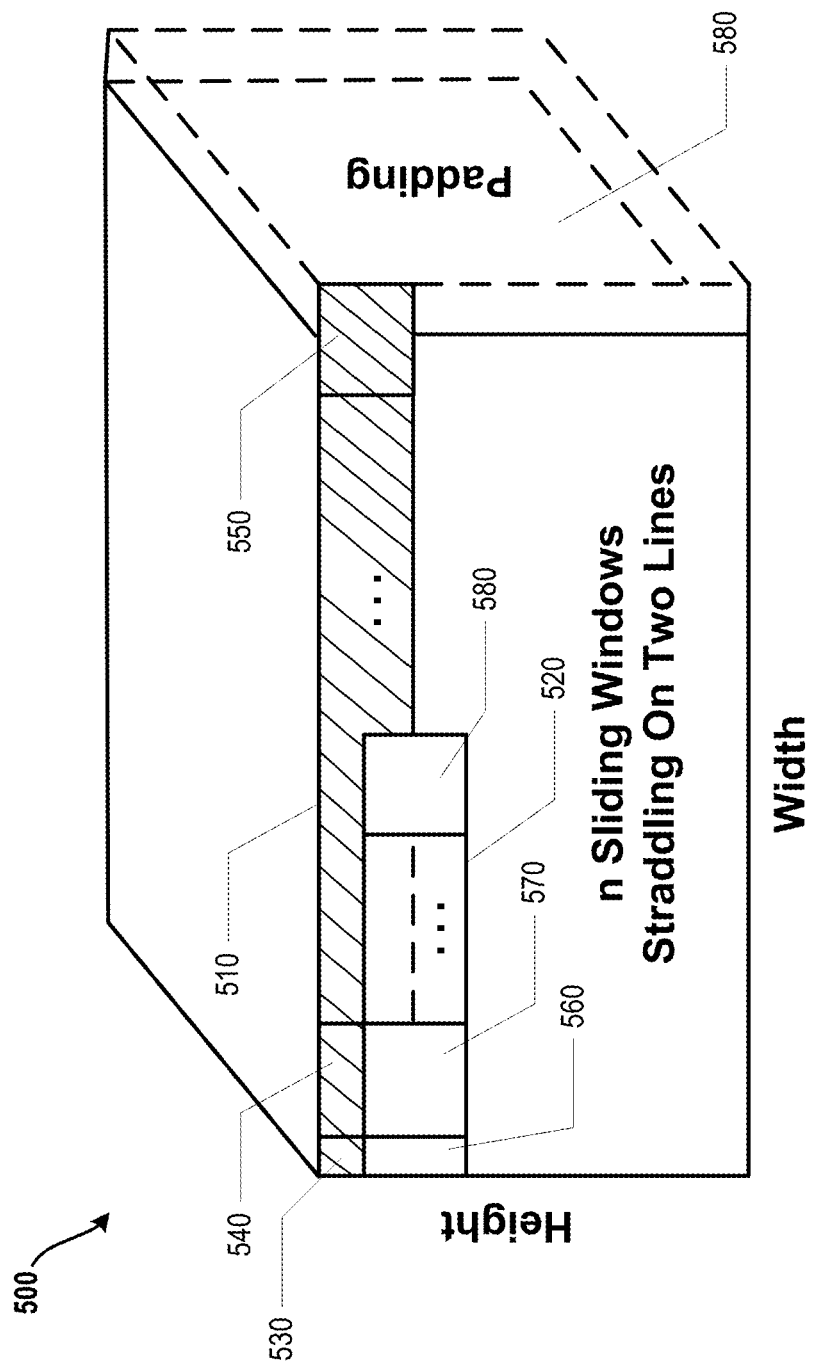
FIG. 5 illustrates a block diagram of exemplary input data represented in an illustrative logical data mapping showing the use of illustrative n sliding windows operative to straddle one or more lines of the illustrative logical data mapping operative to allow for data padding as a processing enhancement in accordance with the herein described systems and methods.

FIG. 5 is similar to FIG. 4 and is presented to describe the ability of the herein described systems and methods to allow for the use of padding to further enhance the performance characteristics of an exemplary neural network environment (e.g., 100 of FIGS. 1 and 200 of FIG. 2). As is shown, logical data map 500 (of exemplary input data not shown) can include various sliding windows (530, 540, 550, 560, 570, and 580) that straddle across one or more lines (e.g., 510 and 520). Additionally, the logical data map 500 can also include padding 580.

In an illustrative operation, at runtime of an exemplary neural network environment (100 of FIG. 1 or 200 of FIG. 2), padding 580 can be added dynamically. The operation controller 235 of FIG. 2 can specify the amount of padding to be used on each of the dimensions 340 shown in FIG. 3 (e.g., such that the dimensions taken collectively can be considered a data volume) of the input data (e.g., blob), and the neural network environment (e.g., iterator controller instructions) can operatively construct data volumes as if the padding was physically present in memory. Default values can also be generated by the exemplary neural network environment (e.g., iterator controller instructions) in the iterator output positions where the padding was added.

FIG. 6 is a block diagram of exemplary line buffer data 600. As is shown in FIG. 6, exemplary line buffer input data 600 can include a bound logical mapping 605 of the line buffer data 600. The logical mapping can include a height and width as well as data elements (605(1), 605(2), 605(3), 605(4), 605(5), 605(6), 605(7), 605(8), 605(9), 605(10), 605(11), 605(12), 605(13), 605(14), 605(15), 605(16), 605(17), 605(18), 605(19), 605(20), 605(21), 605(22), 605(23), 605(24), 605(25), 605(26) and so on). The exemplary data elements can be stored in rows 610, 615, and 620 in the logical mapping and can be iterated using n sliding windows. Line buffer data 600 can also be expressed as unraveled logical mapping 625 having a contiguous data block having individual data segments 630 and 635. The individual data segments can represent the amount of data stored across one or more rows/lines of the line buffer input data. Further, as is shown in FIG. 6, each of the unraveled data segments 630 and 635 can include one or more locations 640 where the line buffer input data block straddle across two lines of the input data. Operatively, an exemplary line buffer can shift the memory block data according to a selected stride width to write discontiguous memory blocks as contiguous memory blocks. In an illustrative implementation, line buffer data 600 can include data retrieved from a cooperating data store and/or cooperating iterator component.

By way of example, while loading the data for processing a convolution layer, an exemplary line buffer can receive one block of memory (e.g., 32 bytes of data) and can distribute a portion of this data block to multiple neurons in a single cycle, by shifting the block by a shifting stride for each consecutive neuron. As such, data for multiple overlapping/consecutive sliding windows can be extracted from a single block in a single cycle. When the sliding windows straddle the input from one line to another, and in the case where the kernel width is larger than 1, then there is a discontinuity point in the data from the last window of the previous line and the first window of the next line. Hence, even if the data for those windows reside in the same memory block in an illustrative local memory, the line buffer may be required to perform two writes in order to account for this discontinuity.

Further, as is shown in FIG. 6, exemplary line data 600 can be stored physically in illustrative memory blocks. As is shown, the exemplary memory block is illustratively shown according to two exemplary memory block writing scenarios 655 and 650. Exemplary line buffer memory data 670A in an illustrative first data writing scenario 655 can include data representative of a first cycle write of data 655A from a number of memory locations (e.g., 655(1), 650(2), 655(3), 655(4), 655(5), 655(6), 655(7), 655(8)), and 655(9). Similarly, exemplary line buffer memory data 670A in an illustrative second data writing scenario 655 can include data representative of a second cycle write of data 650A from a number of memory locations (e.g., 650(10), 650(11), 650(12), 650(13), 650(14), 650(15), 650(16)).

Also, as is shown in FIG. 6, exemplary line buffer data can be written to a single cycle write operation from data stored in memory block 680 according to an exemplary line buffer shift stride operation 660. As is shown, memory block 680 can include a number of memory locations (e.g., 680(1), 680(2), 680(3), 680(4), 680(5), 680(6), 680(7), 680(8), 680(9), 680(10), 680(11), 680(12), 680(13), 680(14), 680 (16) etc.). In an illustrative implementation, and as is shown in FIG. 6, exemplary line buffer data 675A of line buffer 675 can be stored according to a line buffer shift stride operation 660. In a shift stride shift operation 660, a calculated shift stride is applied to shift the data of the memory block 680 data to write line buffer data 675A. The additional shift stride bits 645 can be written to line buffer 675 as part of line buffer 675 allowing for a single cycle processing 680A of memory block 680 data instead of two cycles as would be the case for memory block writes of memory block writing scenarios 650 and 655.

Illustratively, according to the single cycle processing 680A operation of memory block 680, the single write operation as is shown in FIG. 6 can produce an extra row in the line buffer as compared to the double cycle processing 655A and 650A. Operatively, and as is illustratively described by FIG. 6A, the NN can process the extra row of data in the line buffer as part of an NN data processing operation such as convolution to produce output data that can then be discarded during a runtime save operation of the output data generated by the one more cooperating processing units such as neurons.

It is appreciated that although the exemplary memory block data of FIG. 6 is shown to have a shift stride having a value of one applied to allow for the memory to be treated as having a contiguous memory block, that such shift stride is merely descriptive and can have any value necessary to achieve the result of a memory of various data processing operations contemplated by an exemplary neural network environment.

Figure 6A:
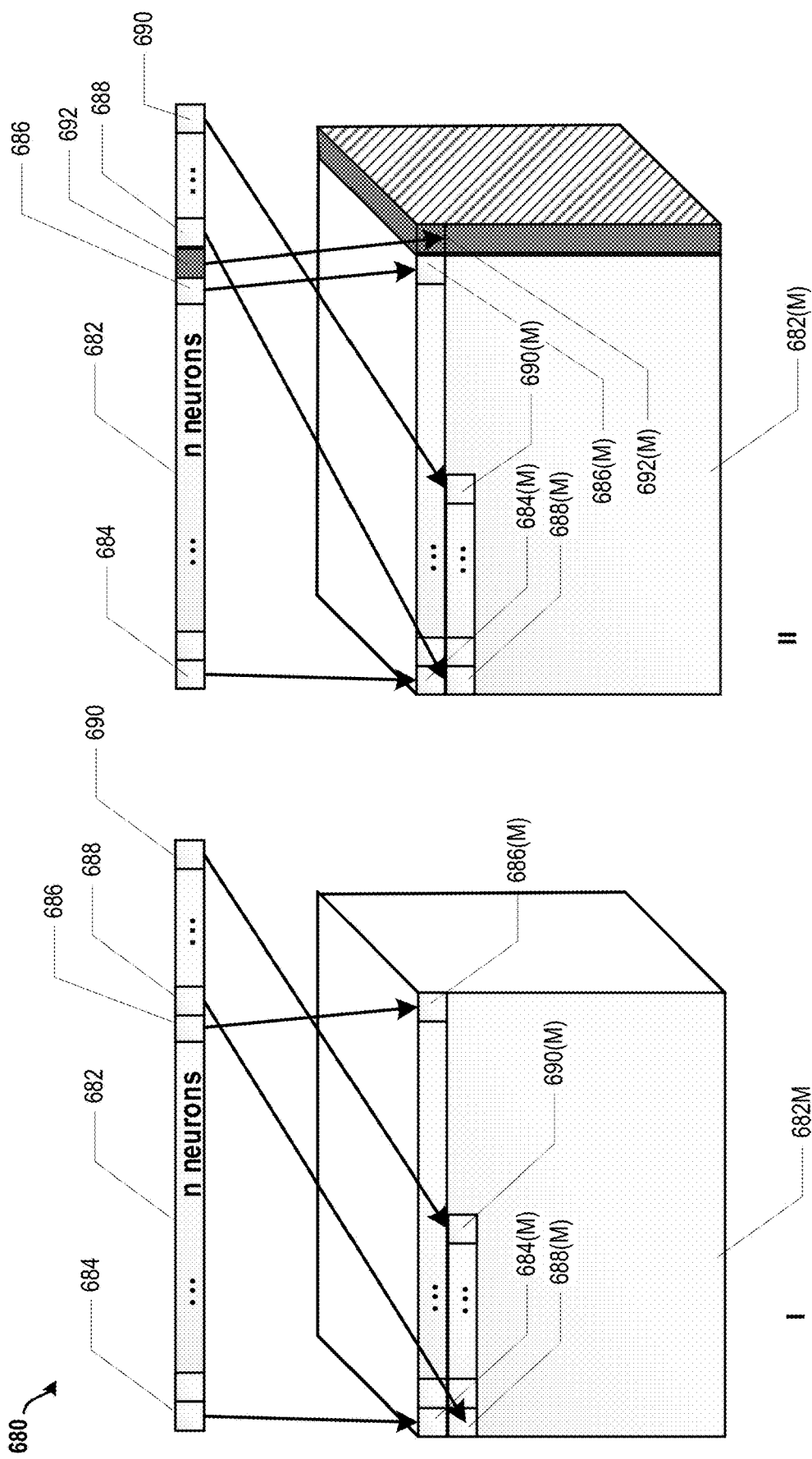
FIG. 6A illustrates a block diagram of exemplary output data represented in an illustrative logical data mapping showing the discarding of inserted shifting stride data bits during an exemplary output write operation.

FIG. 6A shows an exemplary logical data mapping of illustrative output data environment 680 having output data represented according to two output data generation scenarios I and II. As is shown in FIG. 6A, a number of neurons 682 can process data elements (not shown) to generate corresponding output data such as 684(M), 686(M), 688(M), 690(M), and 692(M) for storage in a cooperating memory component 682(M) such as an exemplary line buffer. According to exemplary output data generation scenario I, neurons 684, 686, 688, and 690 can operatively process data elements (not shown) to generate corresponding output data 684(M), 686(M), 688(M), and 690(M). According to exemplary output data generation scenario II, neurons 684, 686, 688, 690, and 692 can operatively process data elements (not shown) to generate corresponding output data 684(M), 686 (M), 688(M), 690(M), and 692(M). As is shown according to exemplary secondary output generation scenario II, exemplary output data element 692(M) that can be generated by exemplary neuron 692 can be operatively discarded during an output data write operation as indicated by the shaded/striped region of the exemplary logical data mapping.

In an illustrative implementation, exemplary output data generation scenario II can represent data processing of an exemplary neural network environment deploying a shift stride operation such as the one described in FIG. 6 such that additional data elements represented by the shift stride operation are processed by exemplary neurons 682 to generate superfluous output data that can be discarded during an exemplary storage of the output data in a cooperating memory component.

FIG. 7 is a flow diagram of an illustrative process 700 utilizing a directed line buffer to minimize the memory reads in a NN/DNN environment. As is shown, processing begins at block 705 where one or more initialization parameters are received from a cooperating component of the neural network computing environment (e.g., operation controller) wherein the one or more initialization parameters can include data representative of the dimensions for input data as well data representative of the calculated discontinuities of the data blocks between rows of the input data. Processing then proceeds to block 710 where the shift stride is calculated that can be used to shift the retrieved data. Illustratively, the shift stride can be calculated using the one or more initialization parameters to generate one or more directed line buffer write instructions (LBWI).

Processing then proceeds to block 715 where data can be retrieved from a cooperating memory store and/or a cooperating iterator component of the neural network environment. Data is then written into one or more rows of the line buffer that are associated with one or more processing units at block 720. The data can be written according to the generated directed line buffer write instructions (LBWI). The LBWI can include one or more instructions to write the data into the line buffer that is shifted by the shift stride according to the received initialization parameters of block 705 that result in a single cycle processing of the input data in the line buffer.

Processing then proceeds to block 725 where the data is communicated to one or more cooperating processing unit(s)(e.g., neuron(s)) for subsequent data processing. The processed data can then act as input to one or more cooperating components of the neural network environment and/or cooperating computing environment. Such output can be displayed for interaction by a participating user. Additionally at block 725, the additional shift stride blocks written into the line buffer and processed by the one or more cooperating processing unit(s) can be discarded when writing from the one or more cooperating processing unit(s) to other cooperating components of the neural network environment.

A check is then performed at block 735 to determine if there is additional input data to be processed (i.e., as part of an iteration operation). If there is no additional input data, processing terminates at block 740. However, if additional input data requires an iteration operation, processing then reverts to block 705 and proceeds from there.

Figure 8:
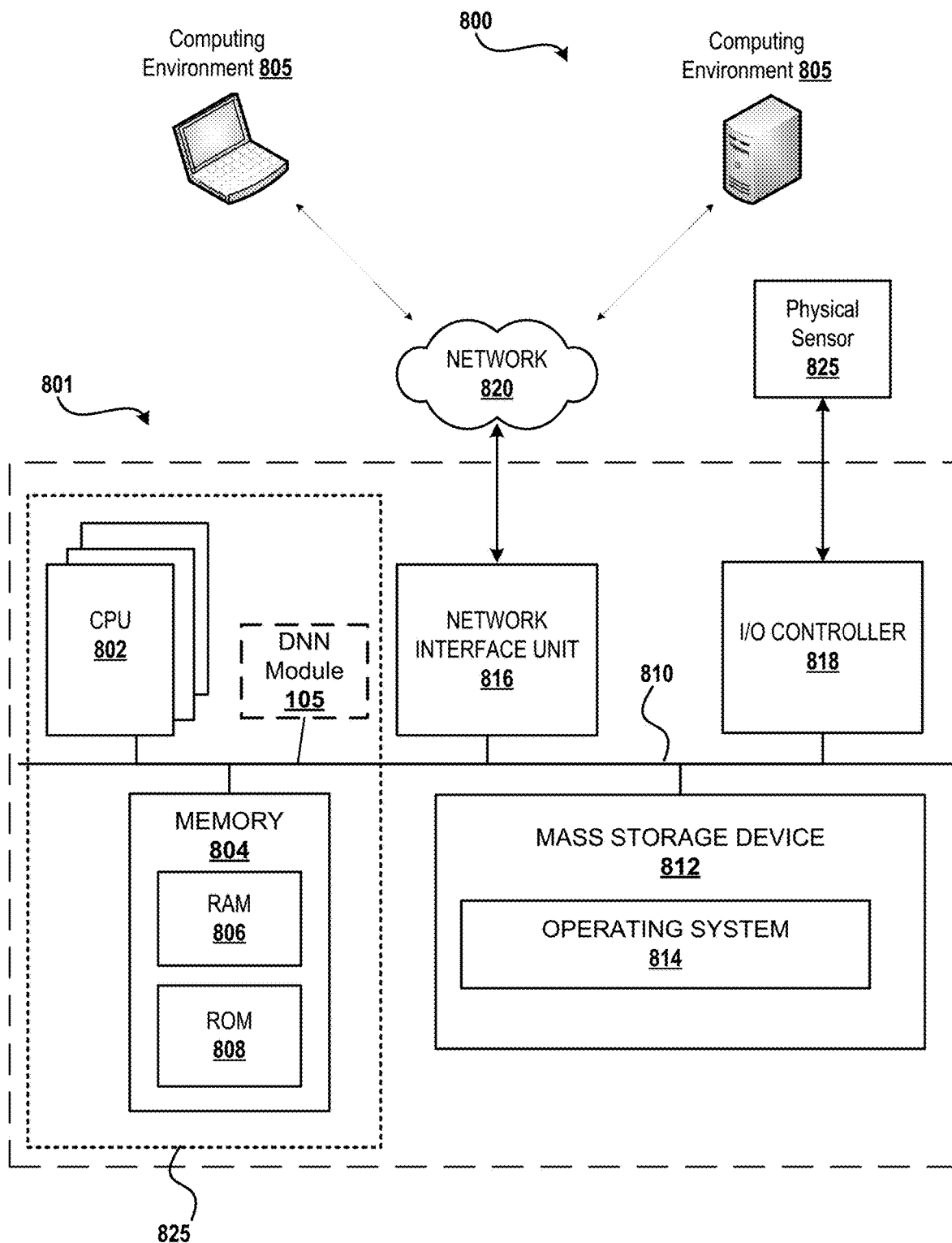
FIG. 8 shows additional details of an illustrative computer architecture for a computer capable of executing the herein described methods.

The computer architecture 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system containing the basic routines that help to transfer information between elements within the computer architecture 800, such as during startup, is stored in the ROM 808. The computer architecture 800 further includes a mass storage device 812 for storing an operating system 814, other data, and one or more application programs.

The mass storage device 812 is connected to the CPU 802 through a mass storage controller (not shown) connected to the bus 810. The mass storage device 812 and its associated computer-readable media provide non-volatile storage for the computer architecture 800. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 800. For purposes of the claims, the phrase "computer storage medium," "computer-readable storage medium" and variations thereof, does not include waves, signals, and/or other transitory and/or intangible communication media, per se.

According to various techniques, the computer architecture 800 may operate in a networked environment using logical connections to remote computers 805 through a network 820 and/or another network (not shown). The computer architecture 800 may connect to the network 820 through a network interface unit 816 connected to the bus 810. It should be appreciated that the network interface unit 816 also may be utilized to connect to other types of networks and remote computer systems. The computer architecture 800 also may include an input/output controller 818 for receiving and processing input from a number of other devices, including a keyboard, physical sensor 825, mouse, or electronic stylus (not shown in FIG. 8). Similarly, the input/output controller 818 may provide output to a display screen, a printer, or other type of output device (also not shown in FIG. 8). It should also be appreciated that via a connection to the network 820 through a network interface unit 816, the computing architecture may enable DNN module 105 to communicate with the computing environment 100.

It should be appreciated that the software components described herein may, when loaded into the CPU 802 and/or the DNN Module 105 and executed, transform the CPU 802 and/or the DNN Module 105 and the overall computer architecture 800 from a general-purpose computing system into a special-purpose computing system customized to facilitate the functionality presented herein. The CPU 802 and/or the DNN Module 105 may be constructed from any number of transistors or other discrete circuit elements and/or chipset, which may individually or collectively assume any number of states. More specifically, the CPU 802 and/or the DNN Module 105 may operate as a finite-state machine, in response to executable instructions contained within the software modules disclosed herein. These computer-executable instructions may transform the CPU 802 by specifying how the CPU 802 transitions between states, thereby transforming the transistors or other discrete hardware elements constituting the CPU 802.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 800 in order to store and execute the software components presented herein. It also should be appreciated that the computer architecture 800 may include other types of computing devices, including hand-held computers, embedded computer systems, personal digital assistants, and other types of computing devices known to those skilled in the art. It is also contemplated that the computer architecture 800 may not include all of the components shown in FIG. 8, may include other components that are not explicitly shown in FIG. 8, or may utilize an architecture completely different than that shown in FIG. 8.

Computing system 800, described above, can be deployed as part of a computer network. In general, the above description for computing environments applies to both server computers and client computers deployed in a network environment.

Figure 9:
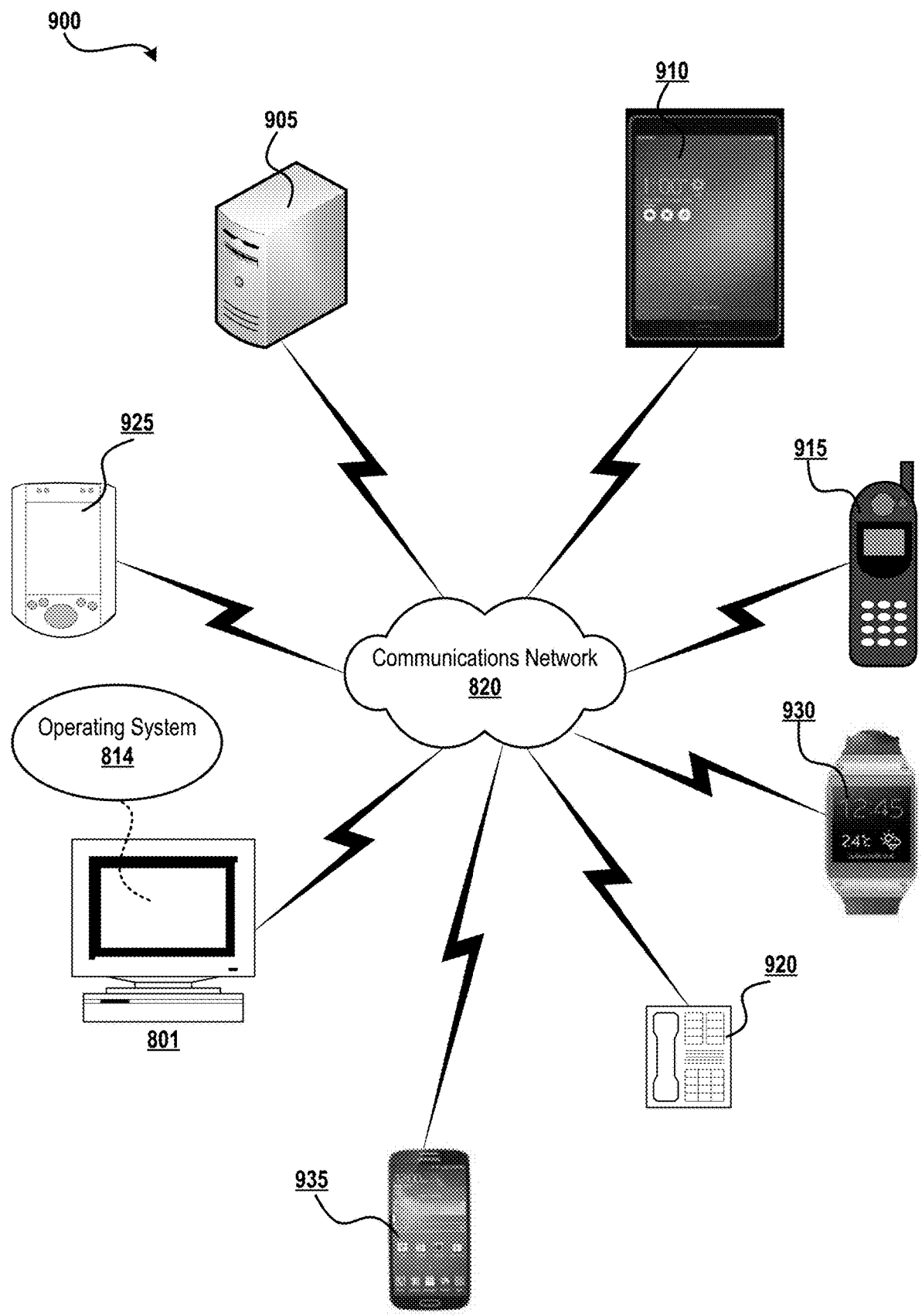
FIG. 9 shows additional details of illustrative computing devices cooperating in accordance with the herein described systems and methods.

FIG. 9 illustrates an exemplary illustrative networked computing environment 900, with a server in communication with client computers via a communications network, in which the herein described apparatus and methods may be employed. As shown in FIG. 9, server(s) 905 may be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing environments such as a tablet personal computer 910, a mobile telephone 915, a telephone 920, a personal computer(s) 801, a personal digital assistant 925, a smart phone watch/personal goal tracker (e.g., Apple Watch, Samsung, FitBit, etc.) 930, and a smart phone 935. In a network environment in which the communications network 820 is the Internet, for example, server(s) 905 can be dedicated computing environment servers operable to process and communicate data to and from client computing environments 801, 910, 915, 920, 925, 930, and 935 via any of a number of known protocols, such as, hypertext transfer protocol (HTTP), file transfer protocol (FTP), simple object access protocol (SOAP), or wireless application protocol (WAP). Additionally, the networked computing environment 900 can utilize various data security protocols such as secured socket layer (SSL) or pretty good privacy (PGP). Each of the client computing environments 801, 910, 915, 920, 925, 930, and 935 can be equipped with operating system 814 operable to support one or more computing applications or terminal sessions such as a web browser (not shown), or other graphical user interface (not shown), or a mobile desktop environment (not shown) to gain access to the server computing environment(s) 905.

Server(s) 905 may be communicatively coupled to other computing environments (not shown) and receive data regarding the participating user's interactions/resource network. In an illustrative operation, a user (not shown) may interact with a computing application running on a client computing environment(s) to obtain desired data and/or computing applications. The data and/or computing applications may be stored on server computing environment(s) 905 and communicated to cooperating users through client computing environments 801, 910, 915, 920, 925, 930, and 935, over an exemplary communications network 820. A participating user (not shown) may request access to specific data and applications housed in whole or in part on server computing environment(s) 905. These data may be communicated between client computing environments 801, 910, 915, 920, 925, 930, 935 and server computing environment(s) 905 for processing and storage. Server computing environment(s) 905 may host computing applications, processes and applets for the generation, authentication, encryption, and communication of data and applications and may cooperate with other server computing environments (not shown), third party service providers (not shown), network attached storage (NAS) and storage area networks (SAN) to realize application/data transactions.

EXAMPLE CLAUSES

The disclosure presented herein may be considered in view of the following clauses.

Example Clause A, A system for enhanced data processing, the system comprising: at least one processor, at least one line buffer operable to perform to read and/or write data, and at least one memory in communication with the at least one processor, the at least one memory having computer-readable instructions stored thereupon that, when executed by the at least one processor, cause the at least one processor to: receive one or more initialization parameters from a cooperating controller component of the neural network environment, the initialization parameters comprising data representative of the dimensions of the data to be processed by the neural network environment and data representative of one or more discontinuities of one or more data elements between one or more rows of the data, load data from a cooperating memory component of the neural network environment, calculate a shift stride representative of the number of bits to shift the one or more data elements of the data according to the initialization parameters, receive one or more instructions from the cooperating controller component of the neural network environment to shift the data elements into the loaded data to generate shift stride shifted data for writing in the at least one line buffer, and communicate the written data in the at least one line buffer to the one or more processing components of the neural network environment for processing.

Example Clause B, the system of Example Clause A, wherein the application of the shift stride results in a single cycle processing of the line buffer in the at least one line buffer.

Example Clause C, the system of Example Clauses A and B, wherein the computer-readable instructions further cause the at least one processor to communicate data that is traversed by a cooperating iterator to the line buffer.

Example Clause D, the system of Example Clauses A through C, wherein the computer-readable instructions further cause the at least one processor to traverse the data utilizing one or more sliding windows, the windows operative to select one or more data elements of the data volume as the one or more portions communicated to the one or more processing components.

Example Clause E, the system of Example Clauses A through D, wherein the computer-readable instructions further cause the at least one processor to traverse the loaded data using one or more sliding windows that straddle a data dimensional boundary of the loaded data.

Example Clause F, the system of Example Clauses A through E, wherein the computer-readable instructions further cause the at least one processor to insert one or more data paddings to the loaded data.

Example Clause G, the system of Example Clauses A through F, wherein the computer-readable instructions further cause additional one or more bits to be processed by the one or more processing units to generate output data for writing to the at least one memory and to discard the additional one or more bits that are processed when performing an output data write.

Example Clause H, a computer-implemented method, comprising: receiving one or more initialization parameters from a cooperating controller component of the neural network environment, the initialization parameters comprising data representative of the dimensions of the data to be processed by the neural network environment and data representative of one or more discontinuities of one or more data elements between one or more rows of the data; loading data from a cooperating memory component of the neural network environment; iterating the loaded data according to a selected iteration operation by a cooperating iterator component of the neural network environment; calculating a shift stride representative of the number of bits to insert in the one or more data elements of the data according to the initialization parameters; receiving one or more instructions from the cooperating controller component of the neural network environment; applying the shift stride into the loaded data to generate directed line buffer data and to write the directed line buffer data in a line buffer according to the one or more initialization parameters; and communicating the written data in the line buffer to the one or more processing components of the neural network environment for processing.

Example Clause I, the computer-implemented method of Example Clause H, wherein the one or more portions of the loaded data are unequal portions.

Example Clause J, the computer-implemented method of Example Clauses H and I, wherein the sliding windows are operative to straddle a data dimensional boundary of the data.

Example Clause K, the computer-implemented method of Example Clauses H through J, further comprising: inserting a padding sub-volume into the loaded data that is defined by the received one or more instructions from the cooperating controller components and by the received one or more initialization parameters.

Example Clause L, the computer-implemented method of Example Clauses H through K, further comprising: processing the written data in the line buffer by the one or more processing units to generate output data.

Example Clause M, the computer-implemented method of Example Clauses H through L, further comprising: processing the output data by an output iterator component to discard additional bits that were processed resulting from the application of the calculated shift stride.

Example Clause N, the computer-implemented method of Example Clauses H through M, further comprising: clearing the line buffer of the written directed line buffer data to receive additional directed line buffer data for writing in the line buffer.

Example Clause O, the computer-implemented method of Example Clauses H through N, further comprising writing the directed line buffer data in a selected number of lines in the line buffer wherein each line of the line buffer is associated with a cooperating processing unit of the neural network environment.

Example Clause P, a computer-readable storage medium having computer-executable instructions stored thereupon which, when executed by one or more processors of a computing device, cause the one or more processors of the computing device to: receive one or more initialization parameters from a cooperating controller component of the neural network environment, the initialization parameters comprising data representative of the dimensions of the data to be processed by the neural network environment and data representative of one or more discontinuities of one or more data elements between one or more rows of the data; load data from a cooperating memory component of the neural network environment; iterate the loaded data according to a selected iteration operation by a cooperating iterator component of the neural network environment; calculate a shift stride representative of the number of bits to shift the one or more data elements of the data according to the initialization parameters; receive one or more instructions from the cooperating controller component of the neural network environment to insert one or more bits into the loaded data to generate directed line buffer data and to write the directed line buffer data in one or more lines of a line buffer wherein the one or more lines of the line buffer are associated with one or more processing components of the neural network environment; and communicate the written data in the one or more lines of the line buffer to the one or more processing components of the neural network environment associated with the one or more lines of the line buffer for processing.

Example Clause Q, the computer-readable storage medium of Example Clause P, wherein the instructions further cause the one or more processors of the computing device to: insert an additional data volume to the loaded data.

Example Clause R, the computer-readable storage medium of Example Clauses P and Q, wherein the instructions further cause the one or more processors of the computing device to: process the written data by the one or more processing units to generate output data.

Example Clause S, the computer-readable storage medium of Example Clauses P through R, wherein the instructions further cause the one or more processors of the computing device to: discard one or more bits of the output data by an output iterator, the discarded bits being representative of the one or more bits inserted when applying the shift stride.

Example Clause T, the computer-readable storage medium of Example Clauses P through S, wherein the instructions further cause the one or more processors of the computing device to: traverse the loaded data utilizing a logical data mapping of the loaded data, the traversing of the loaded data comprising applying one or more sliding windows to the logical data mapping to associate a portion of the loaded data to one or more physical memory addresses.

Example Clause U, the computer readable medium of Example Clauses P through T, wherein the memory component cooperates with a physical sensor capable of producing input data comprising audio data, video data, haptic sensory data, and other data for subsequent processing by the one or more cooperating processing units.

Example Clause V, the computer readable medium of Example Clauses P through U, wherein the cooperating processing units electronically cooperate with one or more output physical components operative to receive for human interaction processed input data comprising audio data, video data, haptic sensory data and other data.

Example Clause W, the computer readable medium of Example Clauses P through V, further comprising first shifting the loaded data according to the calculated first shift bit value, and then shifting the loaded data according to the another shifting bit value.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system for reducing power consumption in a neural network environment, the system comprising:
    at least one processor;
    at least one line buffer operable to perform to read and/or write data; and
    at least one memory in communication with the at least one processor, the at least one memory having computer-readable instructions stored thereupon that, when executed by the at least one processor, cause the at least one processor to:
        receive one or more initialization parameters from a cooperating controller component of the neural network environment, the initialization parameters comprising data representative of the dimensions of the data to be processed by the neural network environment and data representative of one or more discontinuities of one or more data elements between one or more rows of the data;
        load data from a cooperating memory component of the neural network environment;
        calculate a shift stride representative of the number of bits to shift the one or more data elements of the data according to the initialization parameters;
        receive one or more instructions from the cooperating controller component of the neural network environment to shift the data elements into the loaded data to generate shift stride shifted data for writing in the at least one line buffer; and
        communicate the written data in the at least one line buffer to the one or more processing components of the neural network environment for processing.

2. The system of claim 1, wherein the application of the shift stride results in a single cycle processing of the line buffer data in the at least one line buffer.

3. The system of claim 1, wherein the computer-readable instructions further cause the at least one processor to communicate data that is traversed by a cooperating iterator to the line buffer.

4. The system of claim 3, wherein the computer-readable instructions further cause the at least one processor to traverse the data utilizing one or more sliding windows, the windows operative to select one or more data elements of the data volume as the one or more portions communicated to the one or more processing components.

5. The system of claim 4, wherein the computer-readable instructions further cause the at least one processor to traverse the loaded data using one or more sliding windows that straddle a data dimensional boundary of the loaded data.

6. The system of claim 1, wherein the computer-readable instructions further cause the at least one processor to insert one or more data paddings into the loaded data.

7. The system of claim 1, wherein the computer-readable instructions further cause additional one or more bits to be processed by the one or more processing units to generate output data for writing to the at least one memory and to discard the additional one or more bits that are processed when performing an output data write.

8. A computer-implemented method for reducing power consumption in a neural network environment, comprising:
    receiving one or more initialization parameters from a cooperating controller component of the neural network environment, the initialization parameters comprising data representative of the dimensions of the data to be processed by the neural network environment and data representative of one or more discontinuities of one or more data elements between one or more rows of the data;
    loading data from a cooperating memory component of the neural network environment;
    iterating the loaded data according to a selected iteration operation by a cooperating iterator component of the neural network environment;
    calculating a shift stride representative of the number of bits to insert in the one or more data elements of the data according to the initialization parameters;
    receiving one or more instructions from the cooperating controller component of the neural network environment and apply the shift stride into the loaded data to generate directed line buffer data and to write the directed line buffer data in a line buffer according to the one or more initialization parameters; and
    communicating the written data in the line buffer to the one or more processing components of the neural network environment for processing.

9. The computer-implemented method of claim 8, wherein the one or more portions of the loaded data are unequal portions.

10. The computer-implemented method of claim 8, wherein the sliding windows are operative to straddle a data dimensional boundary of the data.

11. The computer-implemented method of claim 8, further comprising:
    inserting a padding sub-volume into the loaded data that is defined by the received one or more instructions from the cooperating controller components and by the received one or more initialization parameters.

12. The computer-implemented method of claim 8, further comprising:
    processing the written data in the line buffer by the one or more processing units to generate output data.

13. The computer-implemented method of claim 12, further comprising:
    processing the output data by an output iterator component to discard additional bits that were processed resulting with an insertion of one or more shift stride bits.

14. The computer-implemented method of claim 8, further comprising:
    clearing the line buffer of the written directed line buffer data to receive additional directed line buffer data for writing in the line buffer.

15. The computer-implemented method of claim 8, further comprising writing the directed line buffer data in a selected number of lines in the line buffer wherein each line of the line buffer is associated with a cooperating processing unit of the neural network environment.

16. A computer-readable storage medium having computer-executable instructions stored thereupon which, when executed by one or more processors of a computing device, cause the one or more processors of the computing device to:
    receive one or more initialization parameters from a cooperating controller component of a neural network environment, the initialization parameters comprising data representative of the dimensions of the data to be processed by the neural network environment and data representative of one or more discontinuities of one or more data elements between one or more rows of the data;

load data from a cooperating memory component of the neural network environment;

iterate the loaded data according to a selected iteration operation by a cooperating iterator component of the neural network environment;

calculate a shift stride representative of the number of bits to shift the one or more data elements of the data according to the initialization parameters;

receive one or more instructions from the cooperating controller component of the neural network environment to insert one or more bits into the loaded data to generate directed line buffer data and to write the directed line buffer data in one or more lines of a line buffer wherein the one or more lines of the line buffer are associated with one or more processing components of the neural network environment; and communicate the written data in the one or more lines of the line buffer to the one or more processing components of the neural network environment associated with the one or more lines of the line buffer for processing.

17. The computer-readable storage medium of claim 16, wherein the instructions further cause the one or more processors of the computing device to:

insert an additional data volume into the loaded data.

18. The computer-readable storage medium of claim 17, wherein the instructions further cause the one or more processors of the computing device to:

process the written data by the one or more processing units to generate output data.

19. The computer-readable storage medium of claim 18, wherein the instructions further cause the one or more processors of the computing device to:

discard one or more bits of the output data by an output iterator, the discarded bits being representative of the one or more bits inserted when applying the shift stride.

20. The computer-readable storage medium of claim 16, wherein the instructions further cause the one or more processors of the computing device to:

traverse the loaded data utilizing a logical data mapping of the loaded data, the traversing of the loaded data comprising applying one or more sliding windows to the logical data mapping to associate a portion of the loaded data to one or more physical memory addresses.

21. The computer readable medium of claim 16, wherein the memory component cooperates with a physical sensor capable of producing input data comprising audio data, video data, haptic sensory data, and other data for subsequent processing by the one or more cooperating processing units.

22. The computer readable medium of claim 21, wherein the cooperating processing units electronically cooperate with one or more output physical components operative to receive for human interaction processed input data comprising audio data, video data, haptic sensory data and other data.

23. The computer readable medium of claim 16, further comprising first shifting the loaded data according to the calculated first shift bit value, and then shifting the loaded data according to the another shifting bit value.

* * * * *